(12) United States Patent
Simonis et al.

(10) Patent No.: US 11,965,935 B2
(45) Date of Patent: Apr. 23, 2024

(54) METHOD AND APPARATUS FOR OPERATING A SYSTEM FOR PROVIDING PREDICTED STATES OF HEALTH OF ELECTRICAL ENERGY STORES FOR A DEVICE USING MACHINE LEARNING METHODS

(71) Applicant: Robert Bosch GmbH, Stuttgart (DE)

(72) Inventors: Christian Simonis, Leonberg (DE);
Christoph Kroener, Rosstal (DE)

(73) Assignee: Robert Bosch GmbH, Stuttgart (DE)

( * ) Notice: Subject to any disclaimer, the term of this patent is extended or adjusted under 35 U.S.C. 154(b) by 186 days.

(21) Appl. No.: 17/537,847

(22) Filed: Nov. 30, 2021

(65) Prior Publication Data

US 2022/0179009 A1 Jun. 9, 2022

(30) Foreign Application Priority Data

Dec. 3, 2020 (DE) ...................... 10 2020 215 297.7

(51) Int. Cl.
*G01R 31/392* (2019.01)
*G01R 31/367* (2019.01)
*G06N 20/00* (2019.01)

(52) U.S. Cl.
CPC ........ *G01R 31/392* (2019.01); *G01R 31/367* (2019.01); *G06N 20/00* (2019.01)

(58) Field of Classification Search
CPC ..... G01R 31/392; G01R 31/367; G06N 20/00
See application file for complete search history.

(56) References Cited

U.S. PATENT DOCUMENTS

| 2017/0242079 A1* | 8/2017 | Duan ..................... B60L 58/15 |
| 2018/0017626 A1* | 1/2018 | Heuser ................... B60R 16/03 |
| 2018/0226824 A1* | 8/2018 | Sakabe ................... B60L 58/12 |
| 2018/0246173 A1* | 8/2018 | Singh .................. G01R 31/392 |

FOREIGN PATENT DOCUMENTS

| DE | 10 2016 218 767 A1 | 3/2018 |
| DE | 10 2018 213 991 A1 | 2/2020 |
| DE | 11 2019 003 222 T5 | 3/2021 |

* cited by examiner

*Primary Examiner* — John C Kuan
(74) *Attorney, Agent, or Firm* — Maginot, Moore & Beck LLP

(57) ABSTRACT

The invention relates to a computer-implemented method for predicting a modeled state of health of an electrical energy store having at least one electrochemical unit, in particular a battery cell, having the following steps: providing a data-based state of health model trained to assign a modeled state of health to the electrochemical energy store on the basis of characteristics of operating variables of the energy store; providing time characteristics of the operating variables that characterize operation of the electrical energy store; and determining a present or predicted modeled state of health on the basis of the generated characteristics of the operating variables using the state of health model, wherein data gaps in the time characteristics of the operating variables owing to a phase of inactivity are completed based on a characteristic of a temperature of the energy store that is derived from at least one provided ambient condition.

20 Claims, 5 Drawing Sheets

METHOD AND APPARATUS FOR OPERATING A SYSTEM FOR PROVIDING PREDICTED STATES OF HEALTH OF ELECTRICAL ENERGY STORES FOR A DEVICE USING MACHINE LEARNING METHODS

This application claims priority under 35 U.S.C. § 119 to application no. DE 10 2020 215 297.7, filed on Dec. 3, 2020 in Germany, the disclosure of which is incorporated herein by reference in its entirety.

TECHNICAL FIELD

The disclosure relates to electrical devices operated independently of the mains and having electrical energy stores, in particular electrically driveable motor vehicles, in particular electric vehicles or hybrid vehicles, and additionally to measures for determining a state of health (SOH) of the electrical energy stores. Additionally, the disclosure relates to not only mobile but also stationary electrical energy stores.

BACKGROUND

The supply of power to electrical devices and machines operated independently of the mains, such as e.g. electrically driveable motor vehicles, is provided using electrical energy stores, normally device batteries or vehicle batteries. These deliver electrical energy for operating the devices. Fuel cells are also possible electrical energy stores, however.

The state of health of an energy store declines appreciably over the course of its life, the effect of which is a declining maximum storage capacity. An extent of the aging of the energy store is dependent on an individual load on the energy store, i.e. in the case of vehicle batteries of motor vehicles on the usage behavior of a driver, external ambient conditions and on the vehicle battery type.

During parked or idle phases, battery data are not usually measured and provided, or are measured and provided only to a greatly reduced extent. This results in time gaps in which there is no or insufficient indication of a stress factor affecting the device battery. These data gaps hamper complete tracking and prediction of the state of health characteristic. However, the prediction of the characteristic of the state of health of the energy stores is an important technical variable, since it allows a financial assessment of a residual value of the energy store.

SUMMARY

The disclosure provides for a method for predicting a state of health of an electrical energy store and an apparatus in an electrically operable device.

Further configurations are specified in the embodiments.

According to a first aspect, there is provision for a computer-implemented method for predicting a state of health of an electrical energy store having at least one electrochemical unit, in particular a battery cell, or by means of rule-based and/or data-based mapping even in an entire system, having the following steps:

provided a data-based state of health model trained to assign a modeled state of health (SOH) to the electrochemical energy store (41) on the basis of characteristics of operating variables (F) of the energy store (41), providing time characteristics of the operating variables (F) that characterize operation of the electrical energy store;

determining a present or predicted modeled state of health (SOH) on the basis of the generated characteristics of the operating variables (F) using the state of health model, wherein data gaps in the time characteristics of the operating variables owing to a phase of inactivity are completed based on a characteristic of a temperature of the energy store that is derived from provided ambient conditions.

The state of health of a rechargeable electrical energy store, in particular a device battery, is usually not measured directly. This would require a series of sensors in proximity to the energy store, which would render the manufacture of such an energy store expensive and complex and would increase the space requirement. Moreover, measurement methods for determining state of health in the devices that are suitable for everyday use are not yet available on the market. The present state of health is therefore normally ascertained using a physical health model in the devices. This physical state of health model is inaccurate in certain situations and usually exhibits model errors of up to more than 5%.

The inaccuracy of the physical health model also means that it can only indicate the present state of health of the energy store. A prediction of the state of health, which is in particular dependent on the manner of operation of the energy store, such as e.g. on the level and amount of charge flowing into and out of a device battery, and hence on a usage behavior and on usage parameters, would lead to very inaccurate predictions and is currently not envisaged.

State of health (SOH) is the key variable for device batteries as an electrical energy store for indicating a remaining battery capacity or remaining battery charge. The state of health describes an extent of the aging of the electrical energy store. In the case of a device battery or a battery module or a battery cell, the state of health can be indicated as a capacity retention rate (SOH-C) or as a rise in the internal resistance (SOH-R). The capacity retention rate SOH-C is indicated as a ratio of the measured present capacity to an initial capacity of the fully charged battery. The relative change in the internal resistance SOH-R rises as the battery ages.

There is great promise in approaches to providing for user- and usage-individual prediction of a state of health of the electrical energy store based on a data-based state of health model. The data-based state of health model can e.g. be implemented in a central processing unit (cloud) and trained using operating variables of the energy store of a multiplicity of devices communicatively connected to the central processing unit.

State of health models for ascertaining states of health for electrical energy stores can be provided in the form of a hybrid state of health model, that is to say a combination of a physical health model with a data-based model. With a hybrid model, a physical state of health can be ascertained using a physical or electrochemical health model and can have a correction value applied to it that is obtained from a data-based correction model, in particular by addition or multiplication. The physical health model is based on electrochemical model equations that characterizes electrochemical states and maps them to a physical state of health, both SOH-C and SOH-R, for output.

Additionally, the correction model for the hybrid data-based state of health model can be produced using a probabilistic or artificial-intelligence-based regression model, in particular a Gaussian process model, and can be trained to correct the physical state of health. In this regard, there is therefore one data-based correction model for the state of health for correcting the SOH-C and/or another for correcting the SOH-R. Possible alternatives to supervised learning are a random forest model, an AdaBoost model, a support vector machine or a Bayesian neural network.

A prediction of the state of health is useful if a remaining life left for the energy store is supposed to be ascertained. This can involve continually querying the data-based state of health model in conjunction with predefined usage patterns of a user of the device having the electrical energy store. This requires ongoing generation of characteristics of artificial operating variables, which is needed by the physical health model. To this end, the operating variables are generated based on load variables.

This prediction option advantageously uses the trained state of health model and usage patterns to generate the input-side time series of operating variables, which means that more accurate calculation or prediction of the state of health is possible than with incomplete data (calculation) or purely extrapolating methods (prediction).

The load variables are generated in a usage model. The usage model is designed to take vehicle-individual usage patterns as a basis for continually outputting characteristics of at least one load variable. This allows a usage behavior parameterized by the usage pattern to be converted into time series of the at least one load variable. The usage pattern can therefore indicate types of load on the energy store using the load variables. The usage patterns can be available as model parameters of the usage pattern model and/or can be provided to the usage pattern model by a database.

The load variable indicates at least one current load for a battery as energy store. Further load variables for a battery as energy store can indicate the temperature load, the temporal frequency of the load and/or periodic loads (periodicity).

The usage model can replicate actual usage behavior by also providing for phases of inactivity and the data reconstruction for these phases of inactivity. In real phases of inactivity predefined by the usage pattern or usage behavior, the energy store is not used and there is no loading of the energy store as a result of electrical energy being supplied or drawn. Nevertheless, the energy store is affected by loading that can be in the form of a temperature of the energy store, without said loading being detected by sensor. In particular in the case of high states of charge of a battery as energy store, a high ambient temperature can additionally load the battery and lead to intensified aging.

Since the battery temperature during a phase of inactivity is substantially dependent on an ambient condition, such as an ambient temperature, an air pressure or a humidity, a usage pattern model and a dynamic model can be used during such phases of inactivity to estimate or predefine the operating variables on the basis of the ambient condition. In this way, an influence of aging can be modeled and therefore calculated and also predicted for phases of inactivity too.

There can be provision for the usage patterns for generating time series of the at least one load variable to be provided on the basis of a driver-individual data-based usage pattern model using historic usage behaviors. The usage patterns are used in particular to reconstruct data gaps during the calculation and to predict the state of health.

Further, there can be provision for a dynamic model having a so-called battery model, which is advantageously in the form of an equivalent circuit model of the energy store, in the form of an electrochemical model or in the form of a single particle model. In particular, the dynamic model can indicate a response to the at least one load variable, and in particular take account of a temperature dependency and/or a non-linearity in the dynamic response characteristic. The dynamic model generates one or more operating variables, which e.g. can comprise a voltage, on the basis of the at least one load variable. For an energy store having a battery cell, the current is provided on the input side of the dynamic model. The output of the dynamic model is the voltage response of the battery cell. This is dependent on the temperature, inter alia, and can also take account of non-linear effects in the response characteristic. The dynamic model can be used to infer voltage and SOC from current and temperature.

Additionally, the characteristic of the temperature during the phase of inactivity can be ascertained by using a data-based temperature model trained to provide a temperature of the energy store on the basis of at least one ambient condition.

In particular, the temperature model can model the temperature of the energy store on the basis of a location of the energy store, in particular a geographical location, and a manner in which the energy store is exposed to the ambient temperature.

Additionally, the ambient conditions can be derived from weather information, in particular using retrieval from a weather database, or by measuring an ambient temperature directly.

There can be provision that during an initial phase of the phase of inactivity the characteristic of the battery temperature is modeled on the basis of a physical cooling model, said cooling model also taking account of the ambient temperature.

Additionally, the temperature of the energy store can be a load variable for a dynamic model, wherein the dynamic model models a voltage of the energy store on the basis of a current during the phase of inactivity and the temperature, the dynamic model being able to be in the form of an equivalent circuit model of the energy store, or in the form of an electrochemical model or in the form of a single particle model.

In particular, the dynamic model can be adapted on the basis of the modeled state of health, in particular by updating model parameters or states of the dynamic model on the basis of the modeled state of health.

Additionally, when a battery is the energy store the dynamic model can provide a state of charge characteristic in the phase of inactivity on the basis of the modeled state of health in accordance with a linear state of charge characteristic between the state of charge at the onset of the phase of inactivity and the state of charge at the end of the phase of inactivity.

Data-based models generally require a training process, for which training datasets are needed. The training datasets can be provided by evaluating one or a multiplicity of devices and/or trials carriers. The training datasets each assign a state of health to characteristics of operating variables. Said state of health can be determined using known methods, e.g. by means of diagnostic measurements in the field, e.g. on the basis of Coulomb counting, or alternatively in the laboratory by way of reference measurements.

The data-based state of health model can be trained based on training datasets, wherein the training datasets are divided into a training set and an extended training set, wherein the health model is parameterized with the training set, and wherein the correction model is trained based on the entire extended training set, wherein the data-based state of health model is tested based on the test set, which is unknown to the model, in order to determine a validity of the data-based state of health model.

There can be provision for the electrical energy store to be operated on the basis of the characteristic of the predicted state of health, wherein in particular a remaining life of the electrical energy store is signaled on the basis of the characteristic of the predicted state of health, or the life is extended by measures to reduce stress factors.

According to further embodiments, the energy store can be used to operate a device, such as a motor vehicle, a pedelec, an aircraft, in particular a drone, a machine tool, a consumer electronics device, such as a cell phone, an autonomous robot and/or a domestic appliance.

According to a further aspect, there is provision for an apparatus for predicting a state of health of an electrical energy store having at least one electrochemical unit, or by means of rule-based and/or data-based mapping even in an entire system, wherein the apparatus is designed to:
provide a data-based state of health model trained to assign a modeled state of health to the electrochemical energy store on the basis of characteristics of operating variables of the energy store,
provide time characteristics of the operating variables that characterize operation of the electrical energy store;
determine a present or predicted modeled state of health on the basis of the generated characteristics of the operating variables using the state of health model, wherein data gaps in the time characteristics of the operating variables owing to a phase of inactivity are completed based on a characteristic of a temperature of the energy store that is derived from provided ambient conditions.

BRIEF DESCRIPTION OF THE DRAWINGS

Embodiments are explained in more detail below with reference to the appended drawings, in which.

DETAILED DESCRIPTION

The method according to the disclosure is described below on the basis of vehicle batteries as an electrical energy store in a multiplicity of motor vehicles as similar devices. A data-based state of health model for the respective vehicle battery can be implemented in a control unit in the motor vehicles. The state of health model can be continually updated or retrained in a central processing unit based on operating variables of the vehicle batteries from the vehicle fleet. Alternatively, the state of health model can be operated purely in a cloud and the results provided for the purpose of calculating the state of health and predicting the state of health. The state of health model is operated in the central processing unit and used to calculate aging and predict aging.

The example above is representative of a multiplicity of stationary or mobile devices with mains-independent supply of power, such as for example vehicles (electric vehicles, pedelecs, etc.), installations, machine tools, domestic appliances, IOT devices and the like, that are connected to a central processing unit (cloud) by way of an appropriate communication connection (e.g. LAN, Internet).

Figure 1:
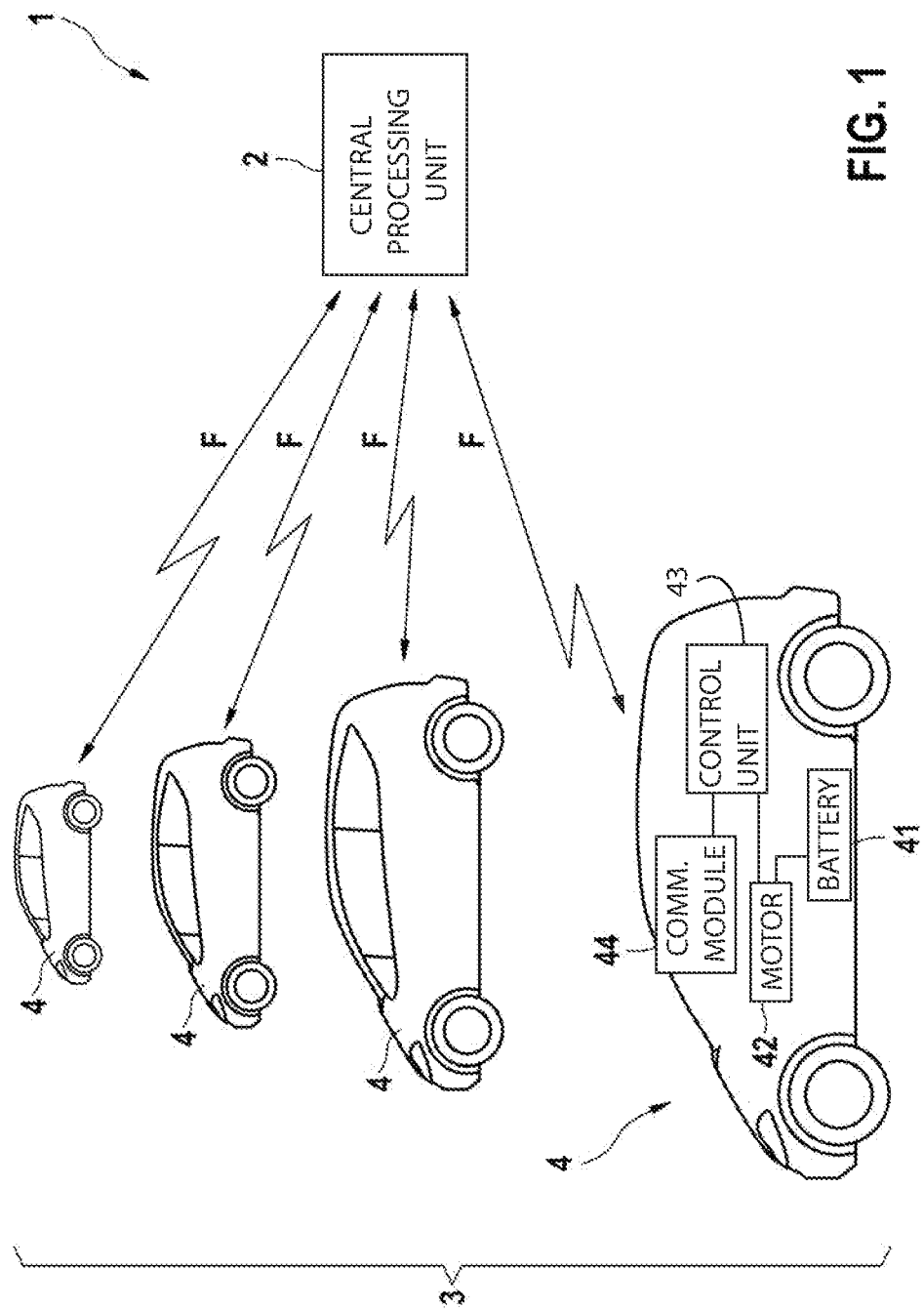
FIG. 1 shows a schematic depiction of a system for providing driver- and vehicle-individual operating variables for determining a state of health of a vehicle battery in a central processing unit.

FIG. 1 shows a system 1 for collecting fleet data in a central processing unit 2 for the purpose of producing and operating and also evaluating a state of health model. The state of health model is used to determine a state of health of an electrical energy store, such as e.g. a vehicle battery or a fuel cell in a motor vehicle. FIG. 1 shows a vehicle fleet 3 with multiple motor vehicles 4.

One of the motor vehicles 4 is shown in more detail in FIG. 1. The motor vehicles 4 each have a vehicle battery 41 as a rechargeable electrical energy store, an electrical drive motor 42 and a control unit 43. The control unit 43 is connected to a communication module 44 that is suitable for transferring data between the respective motor vehicle 4 and a central processing unit 2 (a so-called cloud).

The motor vehicles 4 transmit the operating variables F, which at least indicate variables that influence the state of health of the vehicle battery or are influenced by the state of health of the vehicle battery, to the central processing unit 2. In the case of a vehicle battery, the operating variables F can indicate a present battery current, a present battery voltage, a present battery temperature and a present state of charge (SOC), at pack, module and/or cell level alike. The operating variables F are captured in a fast time frame typically between 0.1 Hz and 100 Hz, depending on the signal, and can be transferred to the central processing unit 2 in uncompressed and/or compressed form on a regular basis. By way of example, the time series can be transferred to the central processing unit 2 in blocks at intervals of between 10 min and several hours.

Operating features M that relate to an evaluation period can be generated from the operating variables F in the central processing unit 2, or in other embodiments also in the respective motor vehicles 4 already. The evaluation period for determining the state of health can be between a few hours (e.g. 6 hours) and several weeks (e.g. one month). A customary value for the evaluation period is one week.

The operating features can for example comprise features referenced to the evaluation period and/or accumulated features and/or statistical variables ascertained over the entire life hitherto. In particular, the operating features can for example comprise: histogram data for the state of charge characteristic, the temperature, the battery voltage, the battery current, in particular multidimensional histogram data regarding the battery temperature distribution over the state of charge, the charging current distribution over the temperature and/or the discharge current distribution over the temperature, accumulated total charge (Ah), an average capacity increase during a charging process (in particular for charging processes in which the charge increase is above a threshold proportion (e.g. 20%) of the total battery capacity), a maximum for the differential capacity during a measured charging process with a sufficiently large swing in the state of charge (dQ/dU: change of charge divided by change of battery voltage), and more.

State of health (SOH) is the key variable for indicating a remaining battery capacity or remaining battery charge. The state of health describes an extent of the aging of the vehicle battery or a battery module or a battery cell and can be indicated as a capacity retention rate (SOH-C) or as a rise in the internal resistance (SOH-R). The capacity retention rate SOH-C is indicated as a ratio of the measured present capacity to an initial capacity of the fully charged battery. The relative change in the internal resistance SOH-R rises as the battery ages.

The central processing unit 2 has a state of health model implemented in it, which is in particular entirely or partly data-based. The state of health model can be used on a regular basis, i.e. e.g. after the respective evaluation period has elapsed, to ascertain the present state of health of the vehicle battery 41 based on the operating features and/or the operating variables. In other words, it is possible to ascertain a state of health of the relevant vehicle battery 41 or of this energy store associated modules or cells based on the operating variables and/or the operating features obtained from the operating variable characteristics of one of the motor vehicles 4 of the fleet 3.

Additionally, it is possible to ascertain operating variables, for example by linear or non-linear extrapolation or using a prediction model, future states of health of the vehicle battery 41. Preferably, data-based algorithms can be used to predict the operating features, such as deep learning algorithms or autoregressive methods using ARIMA models, which characterizes not only trends but also periodicities in the characteristic of the historic operating features for the prediction thereof.

Figure 2:
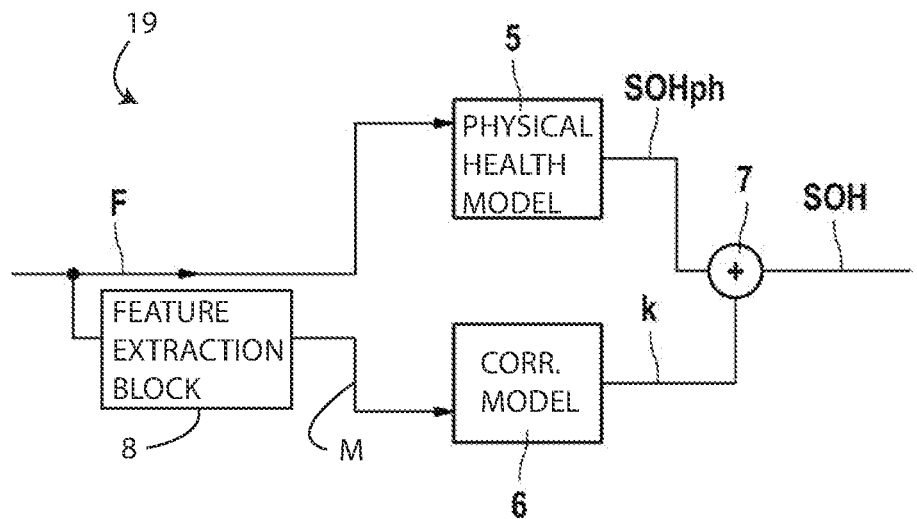
FIG. 2 shows a schematic depiction of a functional design for a hybrid state of health model.

FIG. 2 schematically shows, by way of illustration, the functional design of an embodiment of a data-based state of health model 19, which is designed in a hybrid manner. The state of health model 19 comprises a physical health model 5 and a correction model 6. These receive operating variables F or operating features M from a present evaluation period. The operating features M from the present evaluation period are generated in a feature extraction block 8 based on the time series of the operating variables F.

The operating variables F go directly into the physical state of health model 5, which is preferably embodied as an electrochemical model and describes applicable electrochemical states, such as layer thicknesses (e.g. SEI thickness), change in the cyclizable lithium on the basis of anode/cathode secondary reactions, fast consumption of electrolytes, slow consumption of electrolytes, loss of the active material in the anode, loss of the active material in the cathode, etc.), using non-linear differential equations.

The physical health model 5 corresponds to an electrochemical model of the battery cell and the cell chemistry. This model ascertains internal physical battery states on the basis of the operating variables F in order to a physically based state of health SOHph having the dimension of at least one in the form of the aforementioned electrochemical states, which are linearly or non-linearly mapped to a capacity retention rate (SOH-C) and/or an internal resistance rate of rise (SOH-R) in order to provide them (SOH-C and SOH-R).

The model values for the physical state of health SOHph that are provided by the electrochemical model are inaccurate in certain situations, however, and there is therefore provision for them to be corrected with a correction variable k. The correction variable k is provided by the data-based correction model 6, which is trained using training datasets from the vehicles 4 of the vehicle fleet 3 and/or using laboratory data.

In order to determine a corrected state of health SOH that can be output, the outputs SOHph, k of the physical health model 5 and of the correction model 6, which is preferably embodied as a Gaussian process model, are applied to one another. In particular, they can be added or multiplied (not shown) in a summing block 7 in order to obtain the modeled state of health SOH for a present evaluation period, which modeled state of health can be output. In the case of addition, the confidence in the Gaussian process can continue to be used as the confidence in the corrected health value SOH of the hybrid model, which corrected health value can be output.

If there is not an adequate data basis close to the present operating feature point during the calculation of the state of health, the Gaussian process of the correction model 6 reverts to its prior, and the confidence interval, and hence the uncertainty of the prediction, is extended owing to the extrapolated data situation. The prior is 0 or close to 0, because the Gaussian process was trained to the residual of the purely physical health model, which usually has a normal distribution around 0, in order to correct said health model. If the Gaussian process knows a few known training data points close to the present operating feature point, which have been incorporated into the Gaussian process and hence into the hybrid state of health model by way of the training process, the Gaussian process can correct the state of health with pinpoint accuracy. This makes the uncertainty and hence the confidence interval small or narrow, since the data-driven correction, and therefore in total the state of health model, is very certain on account of the good data situation.

Other configurations of the data-based state of health model are likewise possible, for example the data-based state of health model can be in the form of a non-hybrid, purely data-based model based on a probabilistic or an artificial-intelligence-based regression model, in particular a Gaussian process model, or a Bayesian neural network. This can be trained to provide a modeled state of health SOH from an operating feature point that is determined by present operating features M from a present evaluation period, the operating features M being ascertained in a feature extraction block 8 based on the time series of the operating variables F.

The operating features can be scaled and reduced in dimensions by using a PCA (principal component analysis), in order to reduce redundant linearly dependent information in the feature space as appropriate before training the correction model (unsupervised). Alternatively, a kernel PCA can also be used, so as also to be able to map non-linear effects in the complexity reduction for the data. Both before the reduction in dimensions and specifically thereafter, normalization of the entire operating feature space (or of the principal component space) takes place, e.g. with min/max scaling or the Z transformation.

The calculation of the state of health and the prediction of the state of health are therefore possible for energy stores having at least one electrochemical unit, e.g. a battery cell. The method can also be applied to the entire system of the energy store by means of rule- and/or data-based mapping. Using the example of the battery, the prediction of aging can therefore be applied not only at cell level but also directly at module level and pack level.

Figure 3:
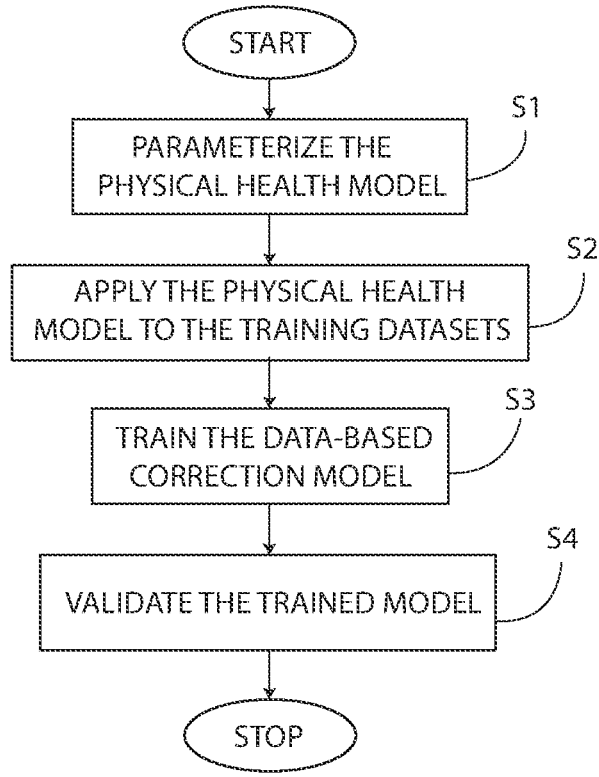
FIG. 3 shows a flowchart to illustrate a method for training a data-based state of health model.

FIG. 3 shows a flowchart to illustrate a method for training the hybrid state of health model in the central processing unit 2. This is accomplished by defining training datasets that assign characteristics of operating variables to a state of health. These training datasets can be collected in the central processing unit 2 from a multiplicity of vehicles or can alternatively or additionally be collected by way of laboratory-based measurements.

These training datasets are divided into a training set and a test set. The training set is used for training the hybrid state of health model, whereas the test set is used for validating the hybrid state of health model using new, unknown data.

In step S1, the physical health model 5 is parameterized on the basis of a first part of the training set, in particular by means of parameter optimization using the least squares method or the like. The physical state of health SOHph as the output from the physical health model 5 is assumed to be the state of health of the respective training dataset.

In step S2, the physical health model is applied to the entire training set of the hybrid model, i.e. a number of training datasets that at least comprises or even goes beyond the amount of training datasets that has been used to parameterize the physical health model. The error in the physical health model is accordingly evaluated in a total error for the residual as a histogram for the model error. This residual contains, in combination with the operating features M or the operating variables F, all the relevant information regarding the systematic weaknesses of the physical health model 5. The information concerning how the physical health model 5 behaves in regard to new training datasets not used for parameterizing the physical health model 5 is also obtained.

In a next step S3, the data-based correction model 6 is trained to the complete training set of the hybrid model. This training set of the hybrid model comprises at least the training set of the physical model in accordance with step S1. The correction model 6 is trained by both extracting the operating features M from the operating variables F and using the internal states of the physical health model 5 as a subset of M in order to map all operating features to an error between the model prediction (physical state of health) of the physical health model and the labeled state of health in accordance with the training dataset. This allows the correction model 6 to learn the weaknesses of the physical health model 5 so as to be able to correct the physical state of health in the correction block.

The data-based correction model 6 can be trained using cross validation and sequential bagging (bootstrap aggregating) in order to improve robustness and accuracy. If the correction model is trained, the trained hybrid state of health model can be validated using a test set that is unknown to the model in step S4, as a result of which the overall performance can be validated for the state of health calculation.

Figure 4:
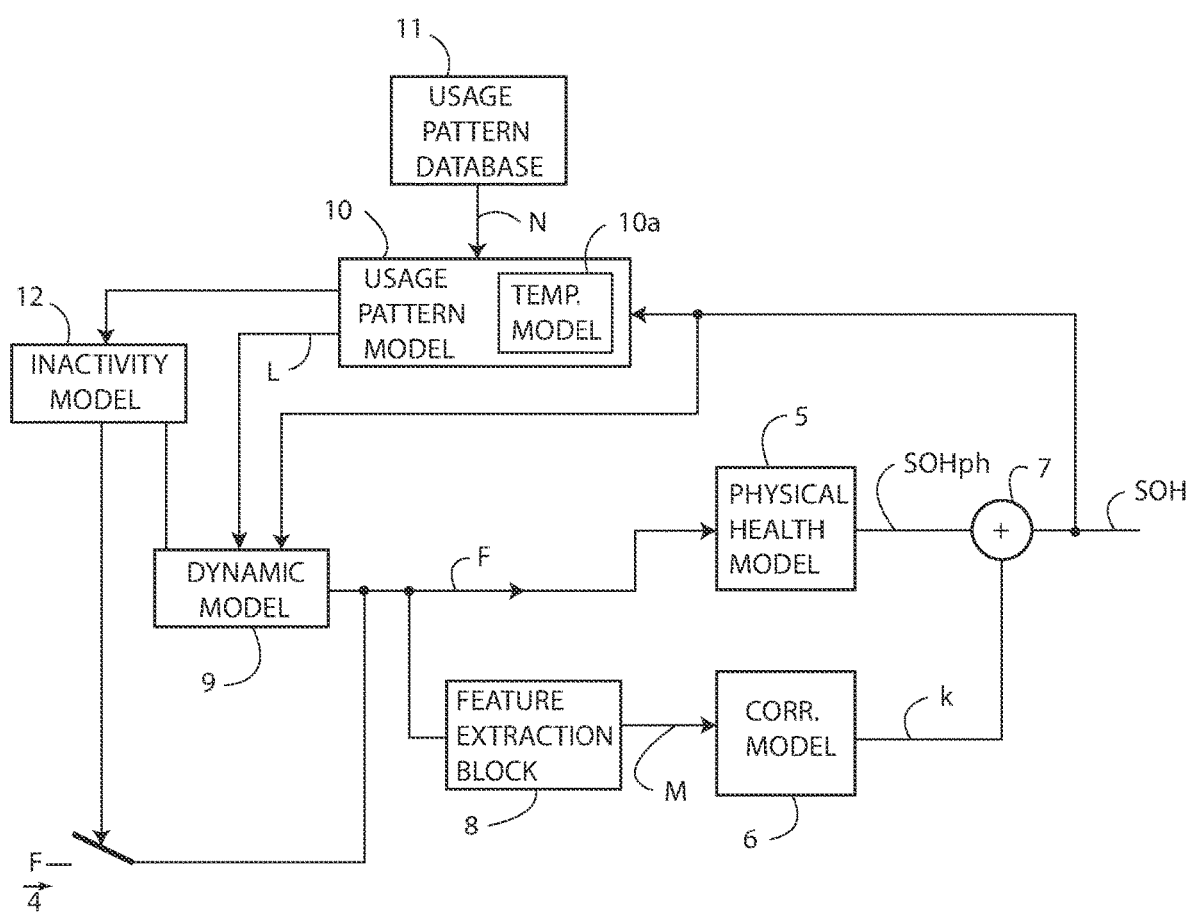
FIG. 4 shows a schematic depiction of a functional design for a hybrid state of health model with usage-dependent prediction of the state of health.

The trained hybrid state of health model can now be used to ascertain the present or predicted state of health based on operating variables F. Specifically when calculating the state of health, this is accomplished by reconstructing inactive phases, specifically with regard to the modeling of the temperature characteristic. To predict a state of health on the basis of usage data, such as e.g. usage patterns N of a driver of a motor vehicle, it is possible to use a model as shown in FIG. 4. The trained hybrid model can therefore also comprise a feature extraction block and a data order reduction block (e.g. with principal component analysis: PCA), as shown in FIG. 2.

The training of the hybrid state of health model can be initiated whenever new labeled data are available, specifically whenever they contain new and relevant information. During operation in a central processing unit based on fleet data, constant retraining of the hybrid state of health model for ascertaining the state of health and for predicting the state of health is therefore possible.

FIG. 4 is based on the hybrid state of health model of FIG. 2, with a dynamic model 9 and a usage pattern model 10 additionally being used in order to generate characteristics of battery voltages U and states of charge SOC, on the basis of load variables L, such as the battery currents I and the battery temperatures T. The dynamic model can comprise a battery model that takes an electrical equivalent circuit model as a basis for generating operating variables from the load variables. It allows this even independently of the provision of real operating variables of the vehicle battery 41, since the physical health model 5 requires time series or characteristics of the operating variables F for modeling the state of health. This is done on the basis of the state of health of the energy store 41 that causes the dynamic model to be updated. The response characteristic of the dynamic model 9 therefore changes on the basis of the age of the energy store 41. Preferably, this is done by updating either parameters and/or states of the dynamic model 9 on the basis of the calculated modeled state of health SOH.

In order to introduce the state of health information into the system dynamics, a usage pattern model 10 is operated on the basis of the modeled state of health SOH. It is thus possible, for example in the case of a vehicle operated using the battery, to allow for a driver being more likely to have to charge 3 times a week when the battery has aged, instead of only 2 times, as initially, in order to cover his desired distance.

The usage pattern model 10 uses predefined usage patterns N. The usage patterns are defined by usage parameters, which can be predefined on a vehicle-individual or driver-individual basis. The usage parameters can be model parameters of the usage pattern model 10, for example.

The usage patterns N are learned by the usage pattern model 10 by means of fleet data on a vehicle-individual basis, preferably using data-based methods, and are used to simulate the usage behavior of a user or a drivetrain in regard to the relevant vehicle battery 41. The usage patterns N can be provided by a usage pattern database 11 that provides a vehicle battery 41 with a previously learned usage pattern in the form of usage parameters.

The usage pattern model 10 results in the usage patterns N leading to the output of time characteristics of a battery current I and a battery temperature T as load variables L, from which the set of operating variables (F) with the time characteristics of the battery voltage U and the state of charge SOC are formed using the dynamic model 9, so that the operating variables' time series that are needed for the state of health model are complete. The usage pattern model can accordingly be in the form of a recurrent neural network (LSTM, GRU) trained with real, vehicle-individual operating variables on the basis of large volumes of data from vehicle batteries and the accordingly resultant aging. The usage pattern model therefore takes a state of health SOH and a usage pattern N as a basis for generating time series of the load variables that characterize the vehicle-individual load profile and, in the hybrid state of health model, lead to an ascertainment of a state of health that corresponds to the usage pattern N.

The usage patterns N can indicate types of load on the energy store, in particular periodic loads derived from a historic operating behavior. The usage patterns N define the load on the relevant vehicle battery 41 and determine characteristics of the load variables such that said load variables correspond to the degradation or the aging characteristic of the relevant vehicle battery 41. As such, frequent fast charging by the fast charging current and a periodicity of the fast charging can be indicated explicitly or implicitly by the usage patterns. Time series, specifically for batteries, currents and temperatures, that include both weekly and seasonal periodicity effects, or linear or non-linear trends, are therefore obtained from the usage patterns N in the usage pattern model 10.

The usage pattern N can also learn and therefore detect or predefine the modeling of phases of inactivity and in particular indicate calendric aging in particular on the basis of ambient conditions. The ambient conditions can e.g. be derived from a climate table, and can indicate a characteristic of the battery temperature within a day/night rhythm, for the seasons and the like, preferably using GPS-dependent weather data from the central processing unit (cloud). The calculated temperature characteristic is therefore the reconstructed battery temperature signal that can be used as input for calculating the SOH in the hybrid model.

Phases of inactivity are phases in which no charging process is carried out and also no discharge as a result of current draw takes place otherwise. In the case of an electric vehicle, these are e.g. parking phases. This is a zero-load case in respect of current, but ambient influences, such as temperature, still take effect as stress factors for battery degradation. Moreover, in general, operating variables are not or are only intermittently captured by sensor in phases of inactivity, which means that up-to-date information about the relevant vehicle battery is not available.

The state of health and the aging of the vehicle battery are in particular dependent on a state of charge of the vehicle battery 41 and the temperature characteristic of the vehicle battery during the phase of inactivity. A usage pattern model 10 can also be used to take account of such phases of inactivity on the basis of ambient conditions and to reconstruct missing time series characteristics of the load variables L, such as battery current and battery temperature. As such, for example self-discharge of the vehicle battery 41 is dependent on ambient influences, such as for example an ambient humidity, an ambient temperature and the state of health at the onset and over the course of the phase of inactivity. In general, the state of charge characteristic during a phase of inactivity can be modeled as a linear characteristic over time, which means that the characteristic of the state of charge SOC can be ascertained from a state of charge SOC1 at the onset of the phase of inactivity and a state of charge SOC2 at or immediately after the end of the phase of inactivity.

An inactivity model 12 is used to monitor the time characteristics of the operating variables F. If there is no phase of inactivity, the operating variables F received from the relevant vehicle 4 are used to calculate the state of health SOH in the manner described above. If it is found that the time characteristics of the operating variables have a time gap of relatively long duration, which indicates that the vehicle has been switched off, then the usage pattern model 10 and the dynamic model 9 are used to generate time characteristics of artificial operating variables. This is accomplished by virtue of the usage pattern model 10 using a temperature model 10a to generate a time characteristic of the battery temperature T and of the battery current (e.g. 0 A) and using the dynamic model 9 to generate a characteristic of the state of charge SOC and of the voltage, as described below. The generated data then replace the conventionally received time characteristics of the operating variables.

Figure 5A:
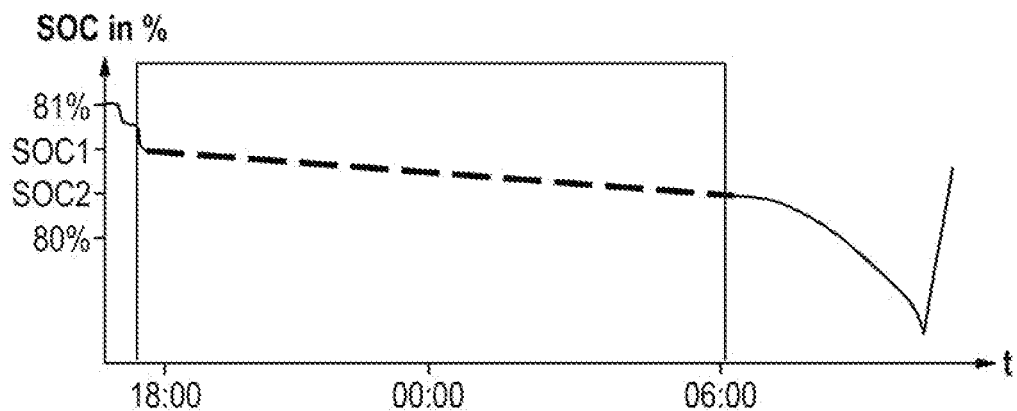
FIGS. 5a-5c show characteristics for the state of charge during a phase of inactivity, a battery temperature and the dependency of the battery temperature on the ambient temperature.

FIG. 5a shows, by way of illustration, the characteristic of the state of charge SOC during a phase of inactivity when the vehicle is parked overnight without being charged. This characteristic of the state of charge SOC during the phase of inactivity can be generated by the dynamic model 9 when a phase of inactivity is detected.

A driver-individual or battery-individual temperature model 10a as part of the usage pattern model 10 can be used to model the characteristic of the battery temperature T based on a characteristic of an ambient condition, in particular the ambient temperature UT, during the phase of inactivity and if applicable a statement relating to the parking location. The characteristic of the ambient conditions, or in particular of the ambient temperature, during the phase of inactivity can be determined for example using weather data for the geographical position of the vehicle at which said vehicle is parked during the phase of inactivity by retrieving historic, present and/or future weather information from a weather database.

Figure 5B:
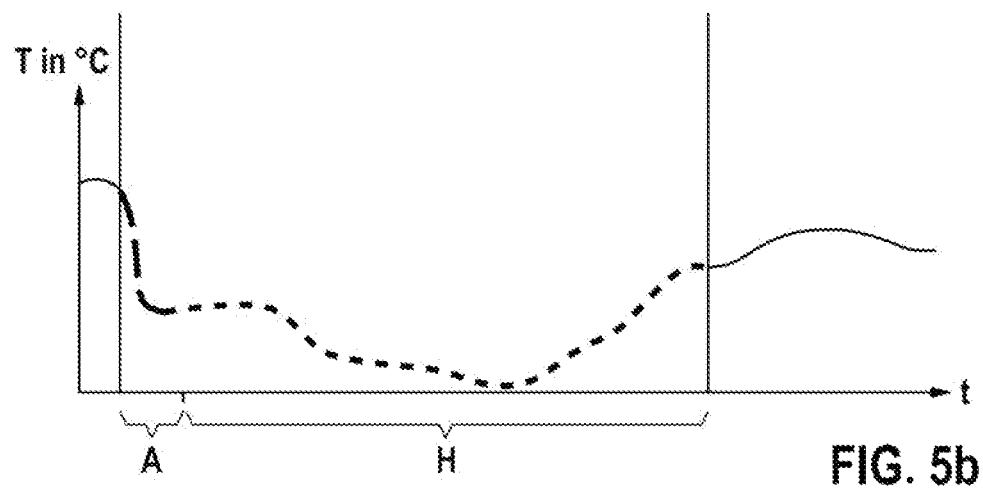

By way of illustration, a temperature characteristic as shown in the graph in FIG. 5b is obtained. A temperature characteristic that is dependent on an ambient temperature characteristic UT can be seen for the main phase H of the phase of inactivity.

Figure 5C:
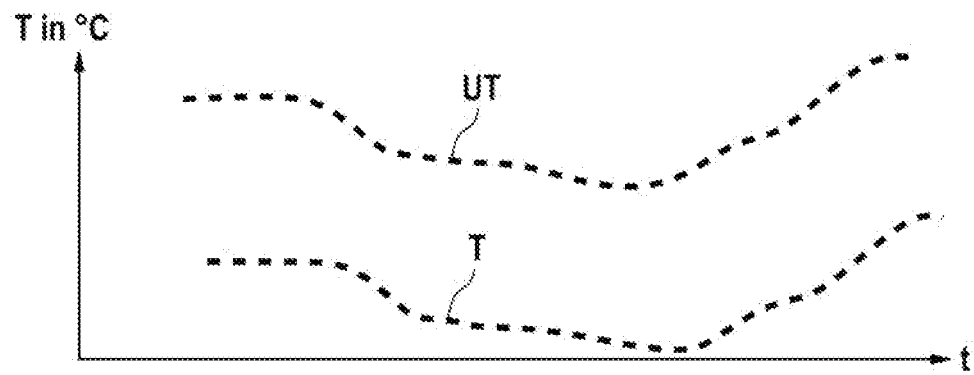
Figure 6:
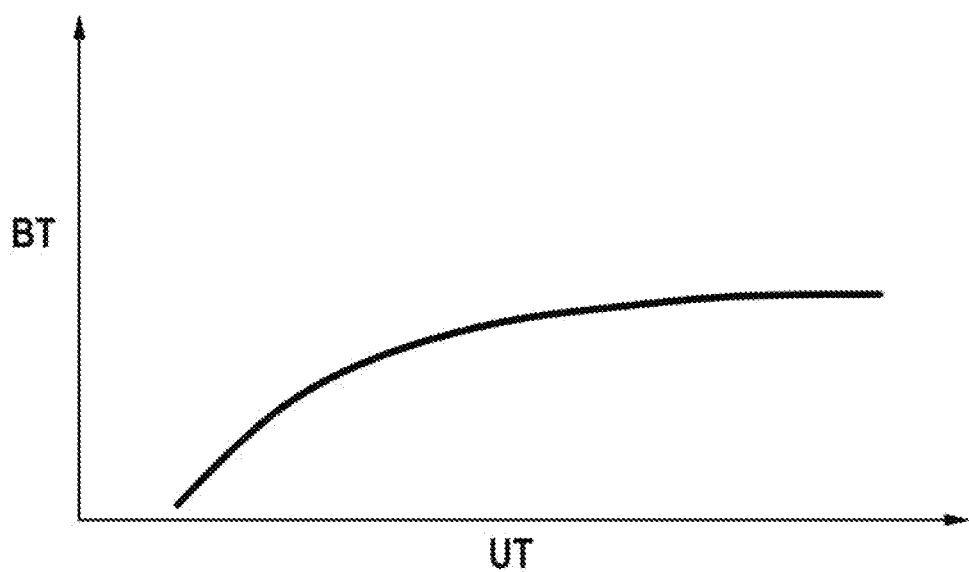
FIG. 6 shows a depiction of a characteristic curve learned for a temperature model by way of training data.

FIG. 5c shows the characteristic of the battery temperature T from the ambient temperature UT. The temperature model maps the ambient temperature UT to the battery temperature BT (=T) and is depicted by way of illustration in the characteristic curve of FIG. 6. The temperature model is trained using training data obtained from the battery temperature and the ambient temperature (specifically in the steady state, e.g. for Ignition ON), in order to learn the relationship between ambient temperature and battery temperature for different temperature ranges and if applicable positions. The temperature model is then trained to assign the battery temperature T to the feature of the ambient temperature UT.

The usage pattern N assigned to the relevant vehicle battery can explicitly or implicitly indicate the parking location at which the vehicle is parked during phases of inactivity. The parking location can be defined as the geographical location at which the vehicle is parked and/or a statement about the type of car park at which the vehicle is parked. The statement about the type of car park can for example stipulate whether the vehicle is stationary at a protected or open position or is parked in a garage. Depending on the parking location, an associated temperature model can be provided that maps the ambient temperature to the temperature affecting the vehicle battery.

It is thus possible to factor in that the temperature model takes into consideration further conditions prevailing at the position, which are able to be learned during the training during the temperature model. As such, for example a vehicle parked in a parking garage a characteristic of the battery temperature can be lower than the characteristic of the ambient temperature during a summer season and can be higher than the characteristic of the ambient temperature during the winter season. By way of example, the temperature model can indicate a battery temperature on the basis of the position of the vehicle and on the basis of the ambient temperature. This model can be applied after a cooling phase of the vehicle battery, so as preferably to map the steady-state part of the battery temperature.

Moreover, in an initial phase A of the phase of inactivity, a generally non-steady-state cooling process starting from the battery temperature at the time of parking can be factored in on the basis of the ambient temperature at the position of the vehicle and the statement about the parking location. A battery temperature in the initial phase A can be modeled using a physics-based cooling model. If the by the physics-based cooling model reaches a battery temperature determined by the temperature model for or approaches it to within a tolerance threshold, so that a steady state has been reached, then the evaluation of the battery temperature T by the cooling model is terminated and the battery temperature T in the main phase H of the phase of inactivity is evaluated using the temperature model.

For any vehicle battery, an appropriate usage pattern that defines a driver-dependent and, if applicable, geoposition-dependent temperature model for phases of inactivity on the basis of a frequently used parking location is learned and provided by way of operating data.

The temperature model for the relevant vehicle battery can be trained using training data that are obtained from a steady-state battery temperature and a steady-state ambient temperature at the end of the phase of inactivity.

After current, which is constantly ~0 A during the phase of inactivity, and the temperature are available as a time series signal (and also the state of charge), the voltage response as a time series signal can then be calculated using the battery model in the dynamic model 9 in order to reconstruct the complete phase of inactivity in the best possible manner.

The above approach allows a characteristic of the state of charge SOC and a characteristic of the battery temperature T during phases of inactivity to be predefined in accordance with a usage pattern N.

The calculation of the present or predicted state of health can therefore factor in the phases of inactivity predefined by the usage pattern N in a suitable manner using data pertaining to characteristics, which means that the state of health can be modeled in an improved manner even if there are no time characteristics of operating variables available. Additionally, the usage patterns learned on a driver-individual basis can also be used to predict the state of health.

The usage model 10 and the dynamic model 9 are adapted by means of updated states of health SOH, preferably by updating the parameters and/or states of the respective models. The dynamic model 9 can be configured in a variety of ways, such as for example an equivalent circuit model, an electrochemical model, a single particle model of battery cells or the like.

Outputs from the dynamic model 9 are a modeled battery voltage (terminal voltage) and a state of charge SOC, each of which is influenced by the modeled state of health SOH.

The possibility of predicting the modeled state of health SOH allows a driver-individual state of health trajectory to be produced for a usage pattern N. The usage pattern N is derived from stress factors and/or can be learned in a driver-individual and data-based manner on the basis of historic fleet data. Preferably, this is accomplished by using autoregressive models or alternatively deep learning methods for pattern recognition.

What is claimed is:

1. A method, which is computer-implemented, for predicting a modeled state of health of an electrical energy store having at least one electrochemical battery cell, the method comprising:

providing a data-based state of health model that is trained to assign a modeled state of health to the electrical energy store based on characteristics of operating variables of the electrical energy store, the data-based state of health model operating on a processor;

providing time characteristics of the operating variables that characterize operation of the electrical energy store to the provided data-based state of health model;

identifying a phase of inactivity of the electrical energy store in which no charging and no discharging of the electrical energy store has occurred, based on the time characteristics of the operating variables;

completing data gaps in the time characteristics of the operating variables during the identified phase of inactivity based on a characteristic of a temperature of the electrical energy store that is derived from at least one provided ambient condition to generate time characteristics of artificial operating variables;

determining a modeled state of health of the electrical energy store based on the provided time characteristics of the operating variables and the time characteristic of the artificial operating variables using the provided data-based state of health model operating on the processor, the determined modeled state of health being one of a present state of health and a predicted state of health; and operating the electrical energy store to extend a remaining life of the electrical energy store based on the determined modeled state of health, wherein the time characteristics of the operating variables are captured in a fast time frame between 0.1 Hz and 100 Hz, wherein each of the time characteristics of the operating variables and the time characteristics of the artificial operating variables include a current, a voltage, a temperature, and a state of charge of the electrical energy store, and wherein the data-based state of health model includes a purely data-based state of health model or a hybrid state of health model.

2. The method according to claim 1 further comprising: ascertaining the characteristic of the temperature during the identified phase of inactivity using a data-based temperature model operating on the processor that is trained to provide a temperature of the electrical energy store based on at least one ambient condition.

3. The method according to claim 2, wherein the data-based temperature model is configured to model the temperature of the electrical energy store based on (i) a location of the electrical energy store and (ii) a manner in which the electrical energy store is exposed to the at least one ambient condition.

4. The method according to claim 3, wherein the location is a geographical location.

5. The method according to claim 2, wherein the data-based temperature model is trained to assign the at least one ambient condition to the temperature of the electrical energy store.

6. The method according to claim 5, wherein training data for training the data-based temperature model are generated by determining a steady-state ambient condition and a steady-state temperature of the electrical energy store at the time of an end of the identified phase of inactivity.

7. The method according to claim 2, wherein the at least one ambient condition is one of (i) derived from weather information from a weather database and (ii) derived by measuring the at least one ambient condition directly.

8. The method according to claim 2, wherein the at least one ambient condition is at least one of (i) an ambient temperature, (ii) an air pressure, and (iii) a humidity.

9. The method according to claim 1 further comprising: modeling, based on a physical cooling model of the electrical energy store, the characteristic of the temperature during a predefined initial phase of the identified phase of inactivity, wherein an initial battery temperature at a start of the identified phase of inactivity is provided to the physical cooling model, and wherein the predefined initial phase ends when the modeled characteristic of the temperature is within a tolerance threshold of a predetermined steady state battery temperature.

10. The method according to claim 1, wherein the temperature of the electrical energy store is a load variable for a dynamic model configured to model a voltage of the electrical energy store based on a current during the identified phase of inactivity and the temperature of the electrical energy store, the dynamic model being one of (i) in a form of an equivalent circuit model of the electrical energy store, (ii) in a form of an electrochemical model, and (iii) in a form of a single particle model.

11. The method according to claim 10 further comprising: adapting the dynamic model based on the determined modeled state of health.

12. The method according to claim 11, the adapting the dynamic model further comprising:
updating one of (i) model parameters and (ii) model states of the dynamic model based on the determined modeled state of health.

13. The method according to claim 10, wherein:
the electrical energy store is a battery; and
the dynamic model provides a state of charge characteristic in the identified phase of inactivity based on the determined modeled state of health in accordance with a linear state of charge characteristic between a state of charge at an onset of the phase of inactivity and a state of charge at an end of the phase of inactivity.

14. The method according to claim 1, wherein the electrical energy store is a battery.

15. The method according to claim 1, wherein the data-based state of health model is in a form of the hybrid state of health model and includes (i) a physical health model that is based on electrochemical model equations and is configured to output a physical state of health of the electrical energy store, and (ii) a trainable data-based correction model that is trained to correct the physical state of health and to provide a corrected physical state of health as the determined modeled state of health.

16. The method according to claim 15, wherein the trainable data-based correction model is at least one of (i) in a form of a regression model and (ii) in a form of a Gaussian process.

17. The method according to claim 1, wherein the electrical energy store is used to operate one of (i) a motor vehicle, (ii) a pedelec, (iii) an aircraft, (iv) a drone, (v) a machine tool, (vi) a consumer electronic device, (vii) a cell phone, (viii) an autonomous robot, and (ix) a domestic appliance.

18. The method according to claim 1, wherein a computer program has instructions that are executed by the processor to cause the processor to carry out the method.

19. An apparatus for predicting a modeled state of health of an electrical energy store having at least one electrochemical battery cell, comprising:
a processor configured to:
provide a data-based state of health model that is trained to assign a modeled state of health to the electrical energy store based on characteristics of operating variables of the electrical energy store;

provide time characteristics of the operating variables that characterize operation of the electrical energy store to the provided data-based state of health model;
identify a phase of inactivity of the electrical energy store in which no charging and no discharging of the electrical energy store has occurred, based on the time characteristics of the operating variables;
complete data gaps in the time characteristics of the operating variables during the identified phase of inactivity based on a characteristic of a temperature of the electrical energy store that is derived from at least one provided ambient condition to generate time characteristics of artificial operating variables;
determine a modeled state of health of the electrical energy store based on the provided time characteristics of the operating variables and the time characteristics of the artificial operating variables using the provided data-based state of health model, the determined modeled state of health being one of a present state of health and a predicted state of health; and
operate the electrical energy store to extend a remaining life of the electrical energy store based on the determined modeled state of health,
wherein the time characteristics of the operating variables are captured in a fast time frame between 0.1 Hz and 100 Hz,
wherein each of the time characteristics of the operating variables and the time characteristics of the artificial operating variables include a current, a voltage, a temperature, and a state of charge of the electrical energy store, and
wherein the data-based state of health model includes a purely data-based state of health model or a hybrid state of health model.

20. A non-transitory machine-readable storage medium for predicting a modeled state of health of an electrical energy store having at least one electrochemical battery cell, the non-transitory machine-readable storage medium storing instructions of a computer program that, when executed by at least one data processing device, cause the at least one data processing device to:
provide a data-based state of health model that is trained to assign a modeled state of health to the electrical energy store based on characteristics of operating variables of the electrical energy store;
provide time characteristics of the operating variables that characterize operation of the electrical energy store to the provided data-based state of health model;
identify a phase of inactivity of the electrical energy store in which no charging and no discharging of the electrical energy store has occurred, based on the time characteristics of the operating variables;
complete data gaps in the time characteristics of the operating variables during the identified phase of inactivity based on a characteristic of a temperature of the electrical energy store that is derived from at least one provided ambient condition to generate time characteristics of artificial operating variables;
determine a modeled state of health of the electrical energy store based on the provided time characteristics of the operating variables and the time characteristics of the artificial operating variables using the provided data-based state of health model, the determined modeled state of health being one of a present state of health and a predicted state of health; and operate the electrical energy store to extend a remaining life of the electrical energy store based on the determined modeled state of health, wherein the time characteristics of the operating variables are captured in a fast time frame between 0.1 Hz and 100 Hz, wherein each of the time characteristics of the operating variables and the time characteristics of the artificial operating variables include a current, a voltage, a temperature, and a state of charge of the electrical energy store, and wherein the data-based state of health model includes a purely data-based state of health model or a hybrid state of health model.

* * * * *